(12) United States Patent
Fong

(10) Patent No.: US 7,518,439 B1
(45) Date of Patent: Apr. 14, 2009

(54) HIGH PRECISION GAIN AMPLIFIER WITHOUT PRECISION PASSIVE COMPONENTS

(75) Inventor: Edison Fong, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 11/874,134

(22) Filed: Oct. 17, 2007

(51) Int. Cl.
*H03F 1/02* (2006.01)

(52) U.S. Cl. .................. 330/9; 300/258; 300/109
(58) Field of Classification Search .......... 330/9, 330/258, 109
See application file for complete search history.

(56) References Cited

U.S. PATENT DOCUMENTS

| | | | |
|---|---|---|---|
| 5,847,607 A * | 12/1998 | Lewicki et al. | 330/258 |
| 6,242,974 B1 * | 6/2001 | Kunst | 330/9 |
| 6,577,185 B1 * | 6/2003 | Chandler et al. | 330/9 |
| 6,952,240 B2 * | 10/2005 | Gower et al. | 348/678 |
| 7,250,813 B1 * | 7/2007 | Yao | 330/9 |
| 7,408,496 B2 * | 8/2008 | Cho | 341/161 |

\* cited by examiner

*Primary Examiner*—Patricia Nguyen
(74) *Attorney, Agent, or Firm*—Patent Law Group LLP; Carmen C. Cook

(57) ABSTRACT

An amplifier circuit uses capacitor as voltage sources so that the amplifier can achieve high precision gain without either ratioed capacitors or absolute value of capacitors or resistors. In one embodiment, the amplifier circuit includes two or more capacitors that are each charged up to the input voltage during the sample phase. Then, during the hold phase, the switching network operates to connect the two or more capacitors in series between the input and output terminals of an operational amplifier, thereby generating an output voltage being N times the input voltage, N being the total number of capacitors connected in series. The amplifier circuit of the present invention is capable of achieving very high precision gain with very high slew rate. In particular, the amplifier circuit achieves very accurate integer gain (1×, 2×, 3×, and so on). Fractional gains can also be obtained with the use of a ratioed capacitor.

10 Claims, 5 Drawing Sheets

HIGH PRECISION GAIN AMPLIFIER WITHOUT PRECISION PASSIVE COMPONENTS

FIELD OF THE INVENTION

The invention relates to amplifiers and, in particular, to a high precision gain amplifier without the use of precision passive components.

DESCRIPTION OF THE RELATED ART

Traditional amplifiers, whether continuous or discrete time, usually depend on either absolute precision components or ratioed precision components to define their gain. A typical continuous time domain gain amplifier using resistors is shown in FIG. 1a. The amplifier of FIG. 1a is the well known feedback opamp configuration. The gain of the amplifier is given by −R2/R1. FIG. 1b shows a switched capacitor amplifier circuit equivalent to the amplifier circuit of FIG. 1a. In either case, the precision gain is determined by the ratio precision of the resistors or capacitors.

In both versions the entire input signal Vin goes through the amplifier and thus the performance of the circuit is limited by the performance of the operational amplifier. In the case of the switched capacitor circuit of FIG. 1b, the amplifier must charge the discharged capacitor C2 during the hold mode. The charging rate is limited by the slewing of the amplifier.

DETAILED DESCRIPTION OF THE PREFERRED EMBODIMENTS

In accordance with the principles of the present invention, an analog amplifier circuit incorporates a switching network to charge up two or more capacitors where the capacitors function as voltage sources to allow the amplifier to achieve high precision gain with a very high slew rate. The amplifier circuit of the present invention is capable of achieving very high precision gain with very high slew rate. In particular, the amplifier circuit achieves very accurate integer gain (1×, 2×, 3×, and so on). Fractional gains can also be obtained with the use of a ratioed capacitor.

Figure 1A:
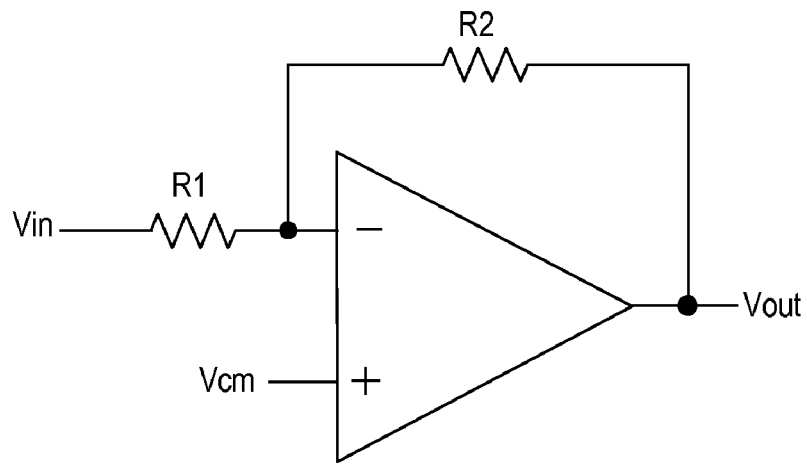
FIG. 1a is a schematic diagram of a conventional continuous time domain gain amplifier using resistors.
Figure 1B:
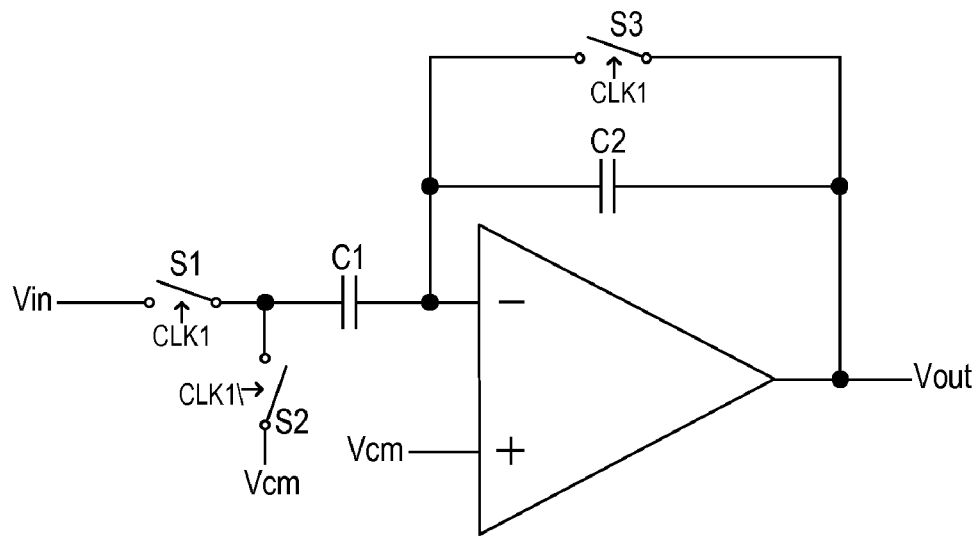
FIG. 1b is a schematic diagram of a conventional switched capacitor amplifier circuit.
Figure 2:
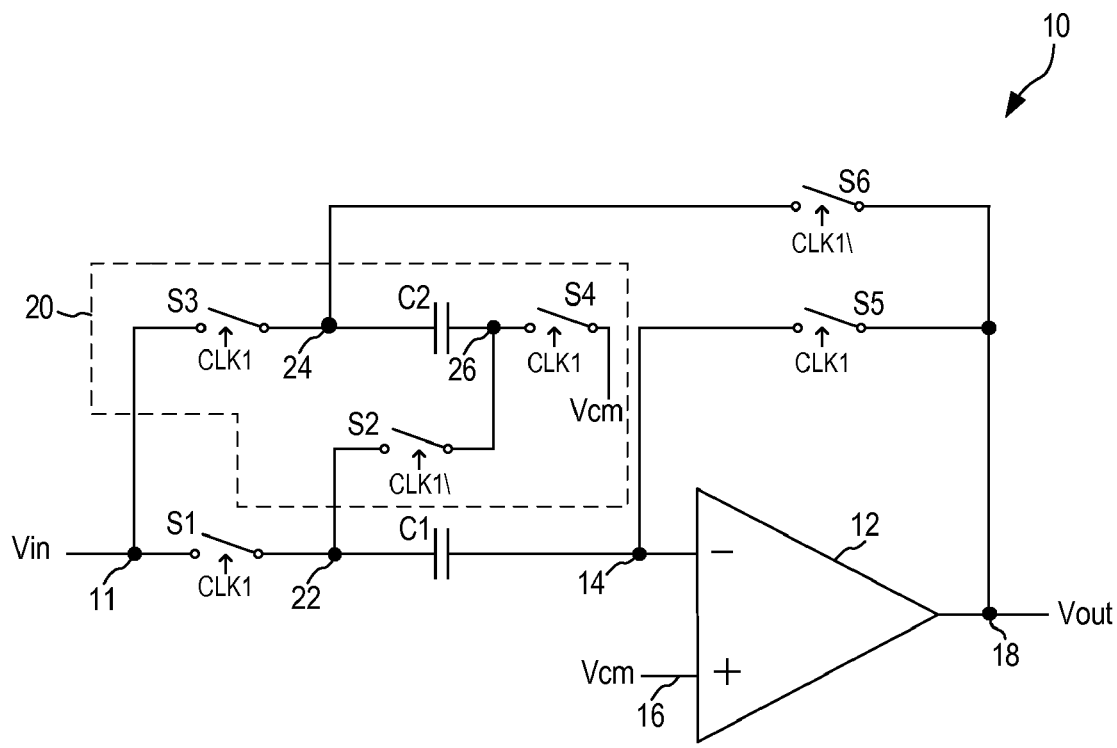
FIG. 2 is a schematic diagram of an amplifier circuit according to one embodiment of the present invention.

FIG. 2 is a schematic diagram of an amplifier circuit according to one embodiment of the present invention. FIG. 2 illustrates a single ended amplifier circuit. The amplifier circuit of the present invention can also be implemented as a differential amplifier, as will be explained in more detail below. Furthermore, the amplifier circuit of FIG. 2 is configured to provide a gain of 2 (that is, 2× gain). The amplifier circuit of the present invention can be configured to provide any integer gain of N, as will be described in more detail below.

Referring to FIG. 2, an amplifier circuit 10 includes an operational amplifier (opamp) 12 having an inverting input terminal 14 coupled to a capacitor and switch network and a non-inverting input terminal 16 coupled to receive a common mode voltage Vcm. Opamp 12 provides an output signal Vout at an output terminal 18. Amplifier circuit 10 receives an input signal Vin and provides an output signal Vout. One of ordinary skill in the art would appreciate that output signal Vout has a voltage polarity that is inverse of input signal Vin. Amplifier circuit 10 includes a capacitor and switch network formed by capacitors C1 and C2 and switches S1 to S6. Switches S1 to S6 are driven by respective clock signal CLK1 or its inverse CLK1\ to configure amplifier circuit 10 in either the sample phase or the hold phase. In the present embodiment, when the clock signal CLK1 is high (and clock signal CLK1\ is low), amplifier circuit 10 is in the sample phase; and when the clock signal CLK1 is low (and clock signal CLK1\ is high), amplifier circuit 10 is in the hold phase. The exact polarity of the clock signal CLK1 is not critical to the practice of the present invention and the opposite polarities for the clock signal can be used as long as the switches S1-S6 are driven to open and close accordingly, as described below.

Capacitor C1 is coupled between switch S1 and the inverting input terminal 14 of opamp 12. The input signal Vin (node 11) is coupled through switch S1 to the first plate (node 22) of capacitor C1 to sample the input signal Vin onto capacitor C1 during the sample phase of the amplifier operation. Switch S5 is connected across the inverting input terminal 14 and the output terminal 18 of opamp 12 to short out the opamp during the sample phase of the amplifier operation. This stores the offset of the opamp 12 on the right side (node 14) of capacitor C1, resulting in offset cancellation.

The capacitor and switch network in amplifier circuit 10 includes a capacitor subcircuit 20. Capacitor subcircuit 20 includes switch S2 connected between the first plate (node 22) of capacitor C1 to a node 26 which is the first plate of a capacitor C2. The capacitor subcircuit 20 further includes switch S4 connected between the first plate of capacitor C2 (node 26) and the voltage Vcm and switch S3 connected between the input voltage Vin (node 11) and the second plate (node 24) of capacitor C2. The capacitor subcircuit 20 is a modular unit which can be repeated for establishing the integer gain of the amplifier circuit, as will be discussed in more detail below. In amplifier circuit 10, only one instance of capacitor subcircuit 20 is used to achieve a gain of 2. Finally, switch S6 connects the second plate (node 24) of capacitor C2 to the output terminal 18 of opamp 12.

Figure 3:
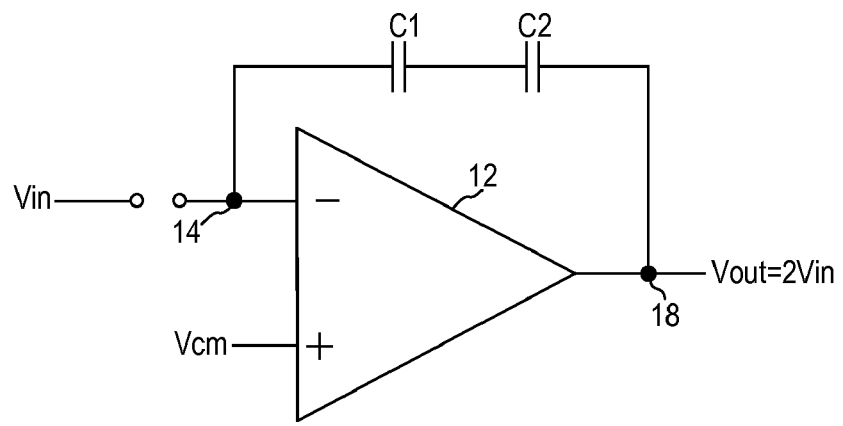
FIG. 3 illustrates the configuration of the amplifier circuit of FIG. 2 during the hold phase of the amplifier operation.

In amplifier circuit 10, switches S1, S3, S4 and S5 are controlled by the clock signal CLK1 while switches S2 and S6 are controlled by the clock signal CLK1\. During the sample phase, the clock signal CLK1 drives switches S1, S3, S4 and S5 to close while clock signal CLK1\ drives switches S2 and S6 to open. During the hold phase, the clock signal CLK1\ drives switches S2 and S6 to close while the clock signal CLK1 drives switches S1, S3, S4 and S5 to open. In operation, during the sample phase, capacitors C1 and C2 are charged up relative to the common mode voltage Vcm. Then, during the hole phase, capacitors C1 and C2 are flipped around so that the capacitors are connected in series between the inverting input terminal and the output terminal of opamp 12, as shown in FIG. 3. Each of capacitors C1 and C2 was charged up to the input voltage Vin during the sample phase. Therefore, the series connection of capacitors C1 and C2 adds up to 2*Vin. Amplifier circuit 10 thus realizes a 2× gain that is independent of the capacitance values. The gain of amplifier circuit 10 is merely multiples of the input voltage Vin where the multiplication factor is the total number of capacitors in the amplifier circuit. When N−1 number of capacitor subcircuits are used so that the amplifier circuit includes N capacitors, a gain of N*Vin is realized.

The operation of amplifier circuit 10 is now described. During the sample phase, switches S1, S3, S4 and S5 are closed while switches S2 and S6 are open. With switches S1, S3 and S4 are closed, the input signal Vin is sampled onto capacitors C1 and C2. Meanwhile, switch S5 is closed to short out the inverting input terminal (14) and the output terminal 18 of opamp 12. The amplifier circuit 10 is thus autozeroed to cancel the offset voltage of the opamp. Because only capacitor C1 is connected to the negative input terminal 14 and the first plate of capacitor C2 is connected to the common mode voltage Vcm, the offset voltage of opamp 12 is sampled only onto capacitor C1.

Following the sample phase, the amplifier circuit enters the hold phase. The equivalent circuit of amplifier circuit 10 in the hold phase is shown in FIG. 3. Referring to FIG. 3, when S1, S3, S4 and S5 are driven to open and switches S2 and S6 are driven to close during the hold phase, capacitors C1 and C2 are switched to be connected in series across the inverting input terminal 14 and the output terminal 18 of opamp 12. Since capacitors C1 and C2 are already charged, opamp 12 does not need to slew a discharged capacitor as in the conventional switched capacitor circuit. Instead, all opamp 12 has to do is to hold the voltage that is charged onto capacitors C1 and C2. An output voltage Vout being 2 times the input voltage Vin (2Vin) is provided almost immediately. The amplifier circuit 10 can realize a magnitude of improvement on the settling time. In fact, the poorer the opamp, the better the settling time improvement. The gain of amplifier circuit 10 is dependent only on how many capacitors are placed in series for the integer multiplication. The amplifier gain is no longer dependent on the capacitance ratios as in the case of the conventional circuits. Thus, capacitors C1 and C2 no longer need to be matched and can have any capacitance value.

In amplifier circuit 10, the opamp offset cancellation voltage is only sampled onto capacitor C1. This ensures that during the hold phase, only one offset voltage is corrected as there is only one opamp and thus one offset voltage Vos. If the offset voltage was sampled across both capacitors C1 and C2, then in the hold phase, the amplifier would correct for 2Vos which would not be the correct value.

As described above, the capacitor subcircuit 20 is a modular unit which can be repeated for establishing the integer gain of the amplifier circuit. In amplifier circuit 10, only one instance of capacitor subcircuit 20 is used to achieve a gain of 2. For a gain of any integer N, N−1 number of capacitor subcircuits is used, resulting in a total of N capacitors. The interconnection of the multiple capacitor subcircuits is as follows. The first switch terminal (node 22) of switch S2 forms a first connection terminal and the second plate (node 24) of capacitor C2 forms a second connection terminal of capacitor subcircuit 20. When additional instances of the capacitor subcircuit are used, the additional capacitor subcircuits will be connected by connecting the second connection terminal (node 24) to the first connection terminal of the next capacitor subcircuit. The second connection terminal of the last capacitor subcircuit is connected to the output terminal of the opamp through a switch, such as switch S6.

Figure 4:
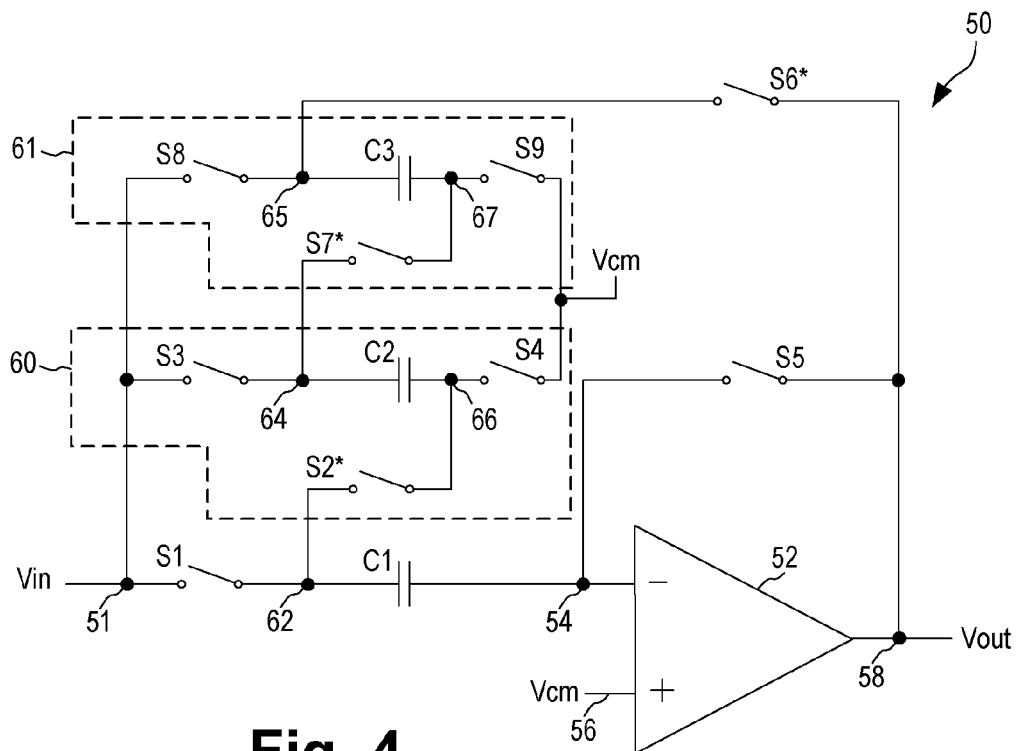
FIG. 4 is a schematic diagram of an amplifier circuit for implementing 3× gain according to an alternate embodiment of the present invention.

FIG. 4 illustrates an amplifier circuit including two capacitor subcircuits for achieving a 3× gain according to an alternate embodiment of the present invention. Referring to FIG. 4, an amplifier circuit 50 includes a switch S1, a capacitor C1, a switch S5 and S6 configured in the same manner as amplifier circuit 10 of FIG. 2. To simplify the drawing, switches that are driven by the inverse of clock signal CLK1 (clock signal CLK1\) have switch names that are labeled with a "*". Switches with switch names that are not labeled with a "*" are driven by the clock signal CLK1.

In amplifier circuit 50, two instances 60, 61 of the capacitor subcircuits are used. Thus, amplifier circuit 50 includes three capacitors C1, C2 and C3. The first capacitor subcircuit 60 and the second capacitor subcircuit 61 are stacked so that during the hold phase when switches S2, S6 and S7 are closed, capacitors C1, C2 and C3 are connected in series across the inverting input terminal and the output terminal of opamp 52. As a result, the output voltage Vout is 3*Vin and a 3× gain is realized. The amplifier circuit of the present invention can be expanded to include any N−1 number of capacitors subcircuits to realize an integer gain of N.

Figure 5:
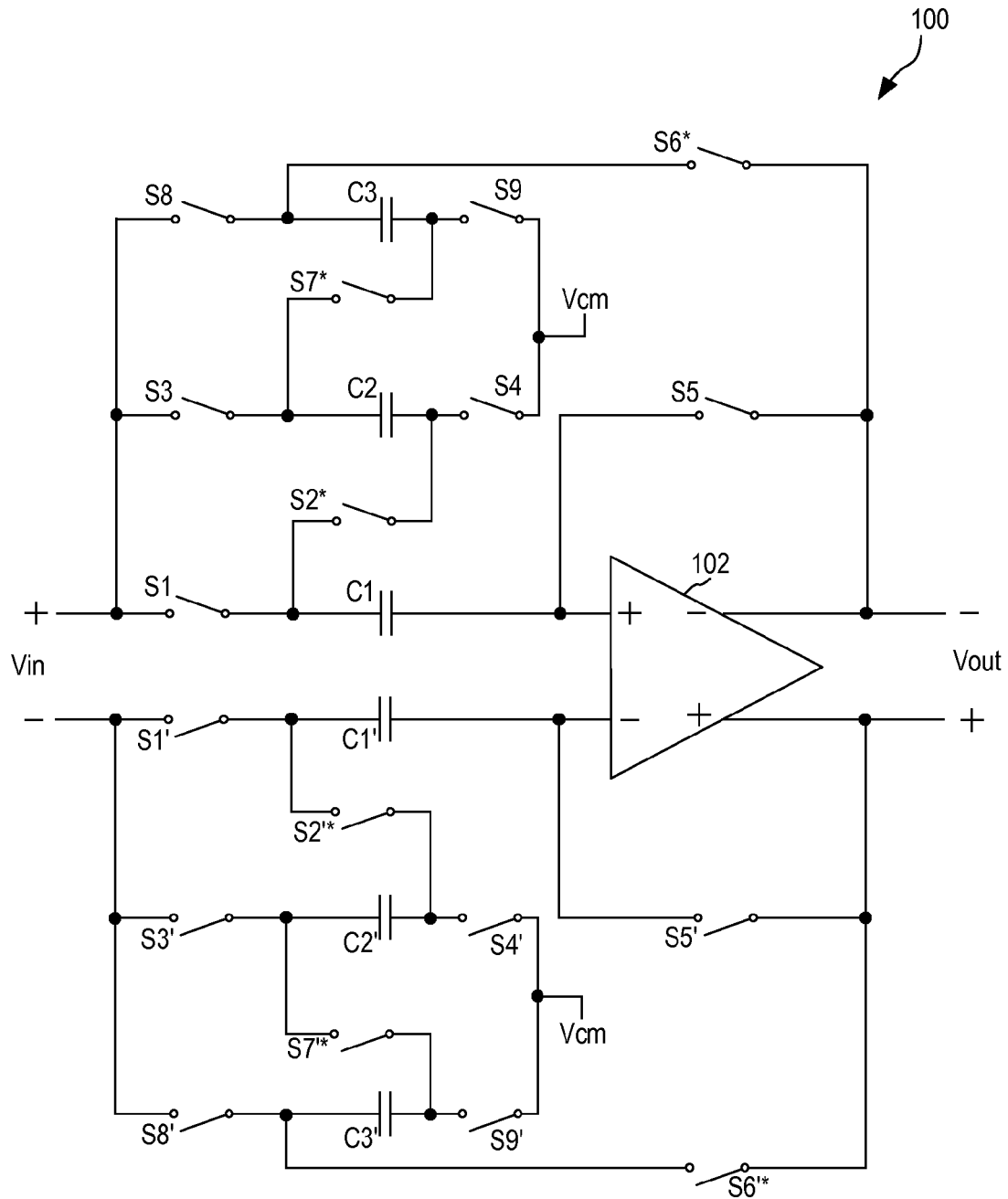
FIG. 5 is a schematic diagram of a fully differential amplifier circuit for implementing 3× gain according to an alternate embodiment of the present invention.

Furthermore, the amplifier circuit of the present invention can be formed as a differential amplifier circuit by duplicating the capacitor and switch network in FIGS. 2 and 4 for the other terminal of the opamp. FIG. 5 is a schematic diagram of a fully differential amplifier circuit for implementing 3× gain according to an alternate embodiment of the present invention. Referring to FIG. 5, an amplifier circuit 100 includes a capacitor and switch subcircuit for both the negative and the positive input terminals of the opamp 102. Amplifier circuit 100 is a fully differential amplifier with a 3× gain that is not dependent on the values or the ratios of the capacitance of the capacitors in the amplifier circuit. The output signal Vout of amplifier circuit 100 has a voltage polarity that is inverse of the input signal Vin, as is understood by one of ordinary skill in the art.

Figure 6:
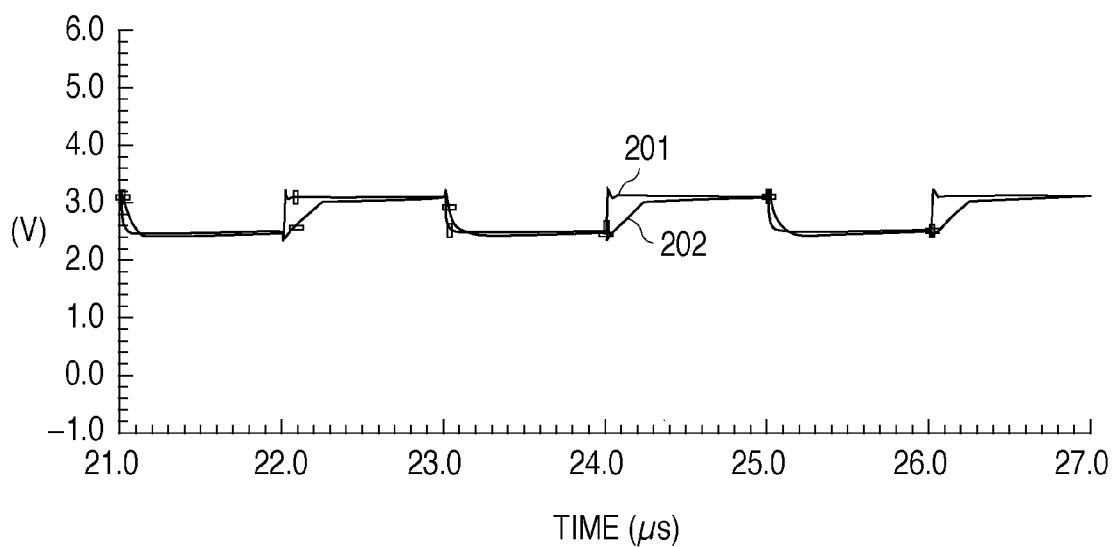
FIG. 6 illustrates signal waveforms of the output signal Vout for the amplifier circuit of FIG. 2 as compared to the conventional switched capacitor amplifier circuit.

FIG. 6 illustrates signal waveforms of the output signal Vout for the amplifier circuit of FIG. 2 as compared to the conventional switched capacitor amplifier circuit. Referring to FIG. 6, waveform 201 is the output signal Vout for the amplifier circuit of FIG. 2 while waveform 202 is the output signal Vout of a conventional switched capacitor circuit. A comparison of the rising and falling edges of waveforms 201 and 202 shows that the settling time of the amplifier circuit of the present invention is greatly reduced. The output signal Vout of the amplifier circuit of the present invention can reach its final value much quicker than the conventional amplifier circuits.

The amplifier circuit of the present invention also has particular advantages when applied in micropower systems since the feedback capacitor(s) in the amplifier circuit need not be charged every cycle as charge is conserved across the capacitor(s). In micropower systems, conservation of charge accounts for much of the power dissipation. During the hold phase, the capacitors need not charge from a zero state in this configuration.

Figure 7:
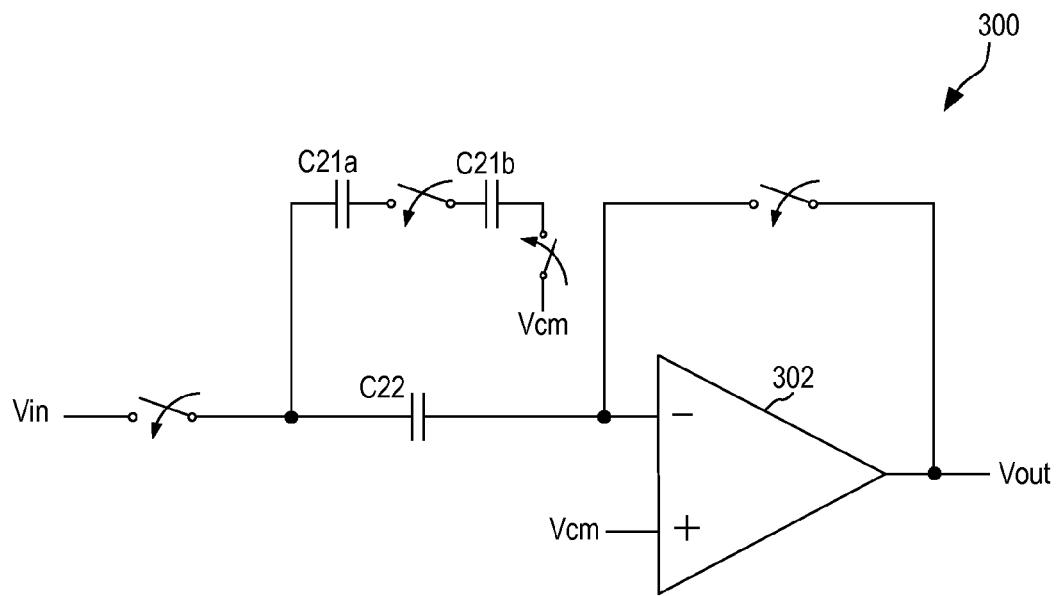
FIG. 7 is a schematic diagram of an amplifier circuit for implementing fractional gain according to one embodiment of the present invention.
Figure 8:
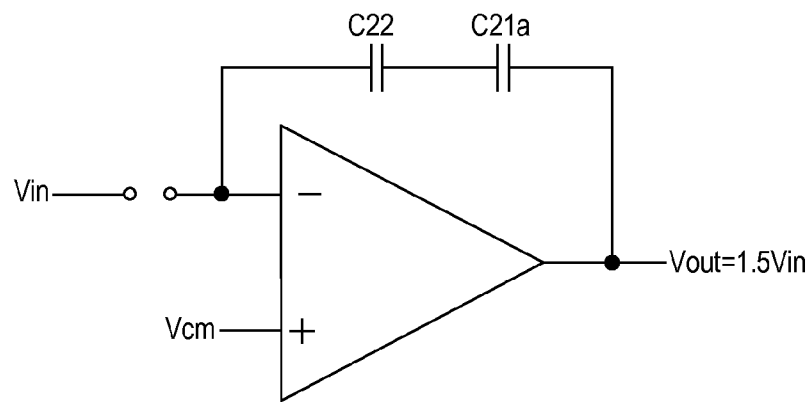
FIG. 8 illustrates the configuration of the amplifier circuit of FIG. 7 during the hold phase of the amplifier operation.

In the above descriptions, the amplifier circuit of the present invention provides precision integer gain that is a function of the number of capacitors that are precharged and then connected in series. The amplifier circuit of the present invention can also be configured to provide factional gain (such as 1.3 or 3.2) where the fractional part of the gain is dependent on the ratios of the capacitors. FIG. 7 is a representative schematic diagram of an amplifier circuit during the sample phase for implementing fractional gain according to one embodiment of the present invention. FIG. 8 illustrates the configuration of the amplifier circuit of FIG. 7 during the hold phase of the amplifier operation.

Referring to FIGS. 7 and 8, to obtain fractional gain, a voltage divider is used in the capacitor subcircuit where the voltage divider is charged up to the input signal Vin during the sample phase. In the present embodiment, the voltage divider is formed by capacitors C21a and C21b. During the sample phase, all the switches are closed and capacitor C22 is charged up to the input voltage Vin while the serial combination of capacitors C21a and C21b is also charged up to the input voltage Vin. Then, during the hold phase, one or more of the capacitors in the voltage dividers are connected in series with capacitor C22, thereby realizing the desired fractional gain. In the present embodiment, it is assumed that capacitors C21a and C21b have the same capacitance values. Then, during the hold phase, only capacitor C21a is connected in series with capacitor C22. A gain of 1.5 is thus realized. By providing a voltage divider in the capacitor subcircuit, any fractional gain value can be obtained using the amplifier circuit of the present invention where the accuracy of the fractional part of the gain will be dependent on the ratio accuracy of the capacitors in the voltage dividers.

The above detailed descriptions are provided to illustrate specific embodiments of the present invention and are not intended to be limiting. Numerous modifications and variations within the scope of the present invention are possible. The present invention is defined by the appended claims.

I claim:

1. An amplifier circuit (50) comprising:
   an operational amplifier (52) having an inverting input terminal (54), a non-inverting input terminal (56) receiving a common mode voltage and an output terminal (58) providing an output voltage;
   a first switch (S1) connected between an input voltage (51) and a first node (62);
   a first capacitor (C1) connected between the first node (62) and the inverting input terminal (54) of the operational amplifier (52);
   a second switch (S5) connected between the inverting input terminal (54) and the output terminal (58) of the operational amplifier (52);
   a third switch (S6) connected between a second node (65) and the output terminal (58) of the operational amplifier (52); and
   one or more capacitor subcircuits, each capacitor subcircuit (60, 61) comprising:
      a fourth switch (S2, S7) connected between a first connection terminal (62, 64) and a third node (66, 67);
      a fifth switch (S3, S8) connected between the input voltage (51) and a second connection terminal (64, 65);
      a second capacitor (C2, C3) connected between the third node and the second connection terminal; and
      a sixth switch (S4, S9) connected between the third node and the common mode voltage,
   wherein the one or more capacitor subcircuits are connected in series, the first connection terminal of a first capacitor subcircuit is connected to the first node and the second connection terminal of a last capacitor subcircuit is connected to the second node; and the second connection terminal of the other capacitor subcircuits is connected to the first connection terminal of the following capacitor subcircuit,
   wherein the first, second, fifth and sixth switches are driven by a first clock signal and the third and fourth switches are driven by the inverse of the first clock signal, and wherein first, second, fifth and sixth switches are closed during a sample phase while the third and fourth switches are closed during a hold phase.

2. The amplifier circuit of claim 1, wherein when the first, second, fifth and sixth switches are closed during the sample phase, the input voltage is charged onto each of the first capacitor and the second capacitors of the one or more capacitor subcircuits.

3. The amplifier circuit of claim 2, wherein when the third and fourth switches are closed during the hold phase, the first capacitor and the second capacitors of the one or more capacitor subcircuits are connected in series between the inverting input terminal and the output terminal of the operational amplifier, the operational amplifier maintaining the voltage charged on the first capacitor and the second capacitors of the one or more capacitor subcircuits.

4. The amplifier circuit of claim 3, wherein the output voltage at the output terminal of the operational amplifier is equal to N times the input voltage, N being an integer and equaling the total number of capacitors that are connected in series between the inverting input terminal and the output terminal of the operational amplifier during the hold phase.

5. The amplifier circuit of claim 1, wherein the amplifier circuit includes N−1 number of capacitor subcircuits.

6. The amplifier circuit of claim 1, wherein the second capacitor in each of the one or more capacitor subcircuits comprises a voltage divider including two or more capacitors (C21a, C21b) switchably connected in series, wherein a selected number of the capacitors in the voltage dividers are connected in series with the first capacitor during the hold phase to generate the output voltage being a fractional multiple of the input voltage.

7. An amplifier circuit (10) comprising:
   an operational amplifier (12) having an inverting input terminal (14), a non-inverting input terminal (16) receiving a common mode voltage and an output terminal (18) providing an output voltage;
   a first switch (S1) connected between an input voltage (11) and a first node (22);
   a first capacitor (C1) connected between the first node (22) and the inverting input terminal (14) of the operational amplifier (12);
   a second switch (S5) connected between the inverting input terminal (14) and the output terminal (18) of the operational amplifier (12);
   a third switch (S6) connected between a second node (24) and the output terminal (18) of the operational amplifier (12); and
   a fourth switch (S2) connected between the first node (22) and a third node (26);
   a fifth switch (S3) connected between the input voltage (11) and the second node (24);
   a second capacitor (C2) connected between the second node and the third node; and
   a sixth switch (S4) connected between the third node and the common mode voltage,
   wherein the first, second, fifth and sixth switches are driven by a first clock signal and the third and fourth switches are driven by the inverse of the first clock signal, and wherein first, second, fifth and sixth switches are closed during a sample phase while the third and fourth switches are closed during a hold phase.

8. The amplifier circuit of claim 7, wherein when the first, second, fifth and sixth switches are closed during the sample phase, the input voltage is charged onto each of the first capacitor and the second capacitor.

9. The amplifier circuit of claim 8, wherein when the third and fourth switches are closed during the hold phase, the first capacitor and the second capacitor are connected in series between the inverting input terminal and the output terminal of the operational amplifier, the operational amplifier maintaining the voltage charged on the first capacitor and the second capacitor.

10. The amplifier circuit of claim 9, wherein the output voltage at the output terminal of the operational amplifier is equal to N times the input voltage, where N is 2 and equals the total number of capacitors that are connected in series between the inverting input terminal and the output terminal of the operational amplifier during the hold phase.

\* \* \* \* \*